United States Patent
Lovato et al.

(10) Patent No.: US 8,593,081 B2
(45) Date of Patent: Nov. 26, 2013

(54) POWER SUPPLY DEVICE AND METHOD FOR A LIGHTING SYSTEM WITH LIGHT-EMITTING DIODES AND LIGHTING ASSEMBLY COMPRISING ONE SUCH DEVICE

(75) Inventors: Jean-Louis Lovato, Biviers (FR); Dominique Persegol, Grenoble (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 136 days.

(21) Appl. No.: 13/301,022

(22) Filed: Nov. 21, 2011

(65) Prior Publication Data

US 2012/0146547 A1 Jun. 14, 2012

(30) Foreign Application Priority Data

Dec. 13, 2010 (FR) ...................................... 10 04837

(51) Int. Cl.
*H05B 37/02* (2006.01)

(52) U.S. Cl.
USPC .......................................... 315/307; 315/297

(58) Field of Classification Search
USPC .......... 315/297, 294, 295, 299, 301, 307, 312
See application file for complete search history.

(56) References Cited

U.S. PATENT DOCUMENTS

| | | | |
|---|---|---|---|
| 6,285,140 B1 | 9/2001 | Ruxton | |
| 7,135,664 B2 | 11/2006 | Vornsand et al. | |
| 2004/0056774 A1 | 3/2004 | Schleicher | |
| 2007/0040696 A1* | 2/2007 | Mubaslat et al. | 340/657 |
| 2009/0179594 A1* | 7/2009 | Yang | 315/307 |
| 2010/0117561 A1 | 5/2010 | Glassner | |
| 2012/0016542 A1* | 1/2012 | Severson | 701/19 |
| 2012/0146547 A1* | 6/2012 | Lovato et al. | 315/297 |

FOREIGN PATENT DOCUMENTS

| | | |
|---|---|---|
| EP | 1 244 334 A2 | 9/2002 |
| EP | 1 379 108 A1 | 1/2004 |
| EP | 1 411 750 A2 | 4/2004 |
| WO | WO 2007/102106 A2 | 9/2007 |
| WO | WO 2008/152565 A2 | 12/2008 |

* cited by examiner

*Primary Examiner* — Daniel D Chang
(74) *Attorney, Agent, or Firm* — Steptoe & Johnson LLP

(57) ABSTRACT

A power supply device and method for selection of a supply voltage or current to be applied to a lighting system having light-emitting diodes. A processing circuit performs automatic detection of the direction of connection of the lighting system by injecting at least one polarity test current pulse. Monitoring of the supply voltage and current during the polarity test current pulse, and reversal of the direction of the current or voltage for monitoring the direction of current flow for attribution of the direction of the supply voltage or current, are also performed. The device and method also include detection of the type of lighting system to be supplied with regulated voltage or regulated current according to the dynamic resistance of said system.

14 Claims, 8 Drawing Sheets

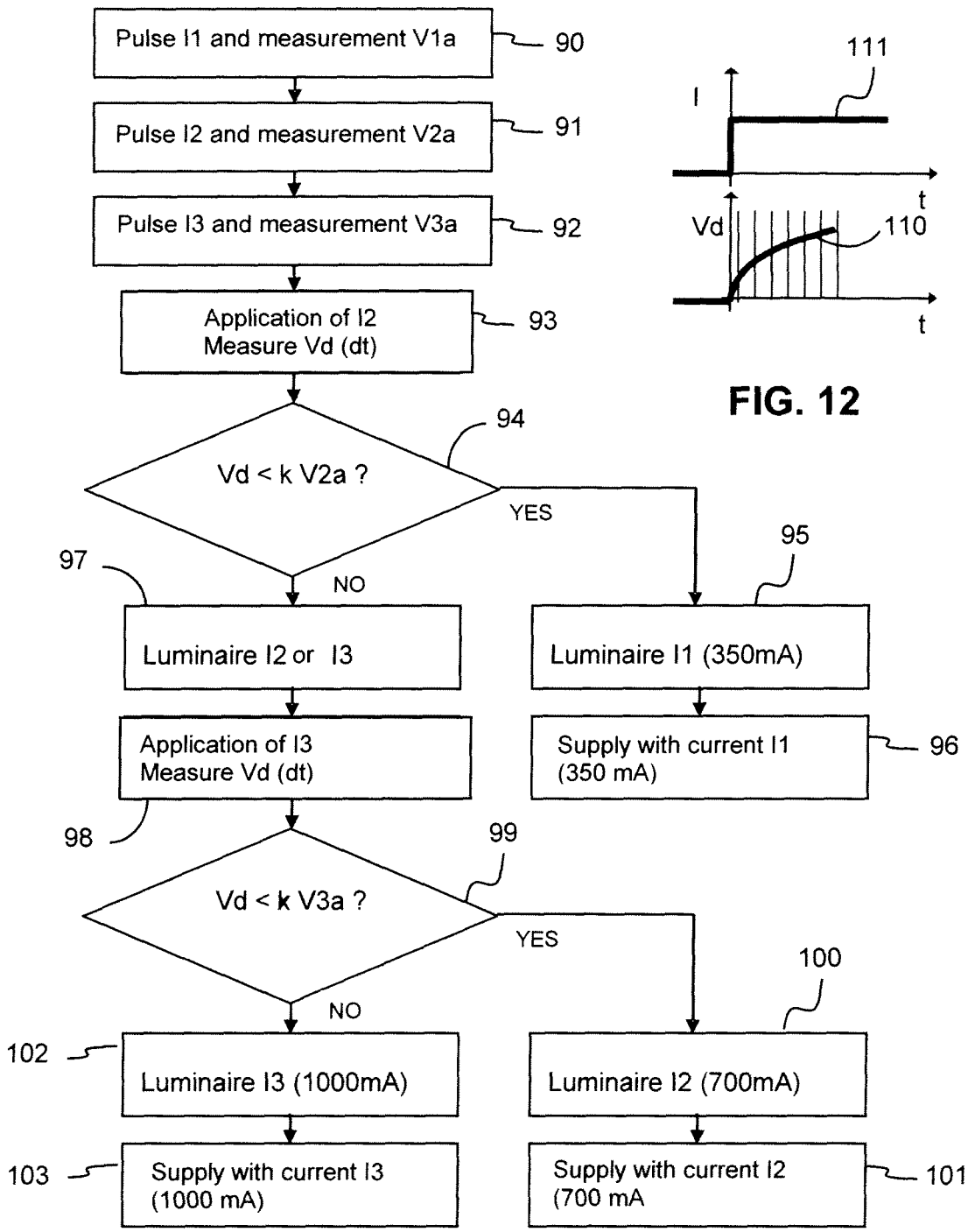

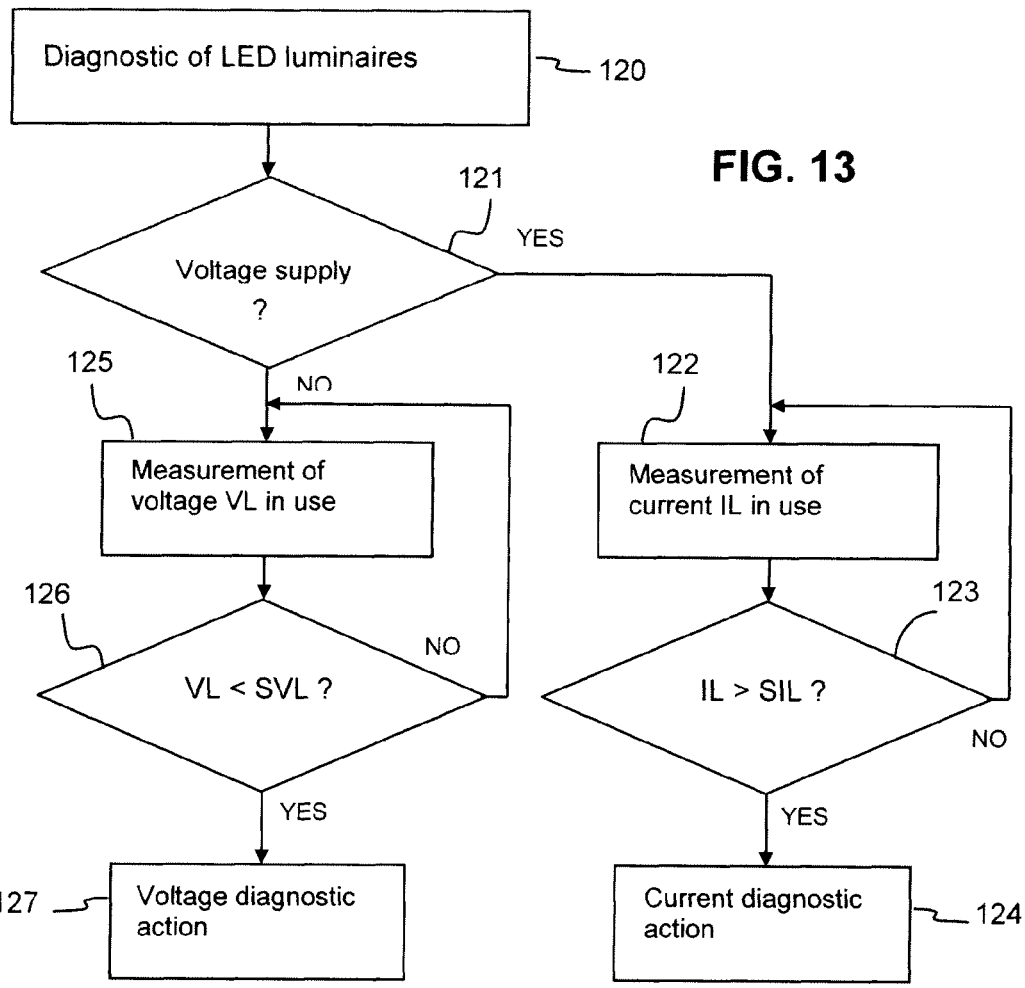
FIG. 13
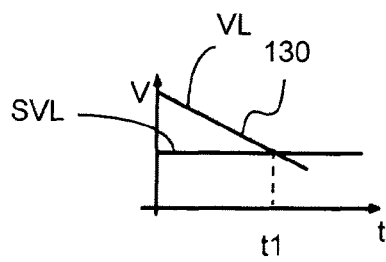
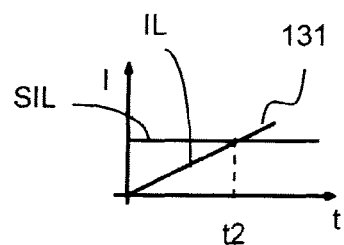
FIG. 14     FIG. 15

POWER SUPPLY DEVICE AND METHOD FOR A LIGHTING SYSTEM WITH LIGHT-EMITTING DIODES AND LIGHTING ASSEMBLY COMPRISING ONE SUCH DEVICE

BACKGROUND OF THE INVENTION

The invention relates to a power supply device comprising:
a DC power supply providing a limited voltage or current on outputs for power supply of a lighting system with light-emitting diodes, said power supply comprising voltage measuring means and current measuring means to monitor a supply voltage and current, and
voltage or current selection means connected to said power supply to select the voltage or current to be applied to said lighting system with light-emitting diodes.

The invention also relates to a lighting assembly with light-emitting diodes comprising at least one power supply designed to be connected to an electric power supply system, and at least one lighting system with light-emitting diodes connected to said at least one power supply device.

The invention also relates to a power supply method for a lighting system with light-emitting diodes comprising:
selection of a supply voltage or current to be applied to said lighting system with light-emitting diodes, and
monitoring of said supply voltage or current.

STATE OF THE ART

Power supply devices for lighting systems with light-emitting diodes generally comprise two output terminals to which lighting modules with light-emitting diodes are connected. These lighting modules comprise light-emitting diodes connected in series or in series/parallel according to the supply voltage and the current or voltage supply mode. The supply voltages or currents are predefined by the manufacturers. For example, the standardized or usual supply voltages are 12, 24 or 48 volts in DC voltage. Generally, the manufacturers supply the power supplies with lighting modules and their own connectors equipped with error preventers. In another example, U.S. Pat. No. 7,135,664 describes a complete layout of a lighting system with light-emitting diodes with current supplies.

However, the power supplies can be provided separately from the lighting modules. This enables greater flexibility and possibilities in lighting installations with light-emitting diodes. Power supplies exist called universal power supplies which propose several electric supply voltages and currents. Such power supplies generally comprise a multitude of terminals to connect the lighting modules on the outputs with suitable voltages or currents and also take account of the polarity of the lighting modules. Other power supplies comprise selector switches to select the supply voltages or currents and the polarity. Such a manual selection of the type of voltage or current supply, of the value of the voltage or current and of the polarity, comprise risks of errors able to result in deterioration of the lighting modules with light-emitting diodes.

SUMMARY OF THE INVENTION

The object of the invention is to provide a power supply device and method of a lighting system with light-emitting diodes enabling automatic selection of electric power supply parameters, and a lighting assembly comprising one such device.

A power supply device according to the invention comprising:
a DC power supply providing a limited voltage or current on outputs for power supply of a lighting system with light-emitting diodes, said power supply comprising voltage measuring means and current measuring means to monitor a supply voltage and current, and
voltage or current selection means connected to said power supply to select the voltage or current to be applied to said lighting system with light-emitting diodes,
comprises automatic detection means of the direction of connection of said lighting system comprising:
means for injecting at least one polarity test current pulse for detection of current flow,
processing means comprising monitoring means of supply voltage and current during the polarity test current pulse, and
means for reversing the direction of the current or voltage controlled by said processing means to monitor the direction of current flow and for attribution of the direction of the supply voltage or current.

Advantageously, said processing means comprise fault detection means if the supply current is flowing in both directions or is blocked in both directions during the polarity test current pulse.

In a preferred embodiment, said processing means comprise means for detecting the type of lighting system with light-emitting diodes with regulated voltage or regulated current supply, said means for detecting the type comprising means for determining a dynamic resistance of said lighting system with light-emitting diodes and means for comparing said dynamic resistance with a threshold.

Preferably, said processing means comprise means for determining a regulated supply voltage for a lighting system with light-emitting diodes supplied with voltage comprising:
means for injecting voltage values, and
means for detecting a supply voltage by choosing the lowest voltage value enabling an electric supply current greater than a threshold to be conducted.

Advantageously, said processing means comprise means for determining a regulated supply current for a lighting system with light-emitting diodes supplied with current comprising:
means for injecting current values to determine DC voltage values at ambient temperatures and/or when cold before use,
means for injecting current values and for monitoring DC voltage variations, and
means for detecting a supply current by choosing the lowest current value for which a DC voltage is lower than a portion of the DC voltage value at a pre-recorded ambient temperature.

In a particular embodiment, said processing means comprise diagnostic means to detect the state of the light-emitting diodes in operation, said processing means comprising:
means for monitoring the current when the lighting system with light-emitting diodes is supplied with voltage and/or means for monitoring the DC voltage when the lighting system with light-emitting diodes is supplied with current, and
means for processing a diagnostic result when the current exceeds a threshold if the system is supplied with voltage and/or when the DC voltage drops below a threshold when the system is supplied with current.

In a lighting assembly with light-emitting diodes comprising at least one power supply device designed to be connected to an electric power supply system, at least one lighting system with light-emitting diodes connected to said at least one power supply device, the power supply device is a device as defined above comprising processing means for processing automatic selection of the power supply of said at least one lighting system with light-emitting diodes.

A power supply method for a lighting system with light-emitting diodes according to the invention comprising:
   selection of the supply voltage or current to be applied to said lighting system with light-emitting diodes, and
   monitoring of said supply voltage and of said supply current, comprises automatic detection of the direction of connection of said lighting system by performing:
      injection of least one polarity test current pulse for detection of current flow,
      monitoring of said supply voltage and of said supply current during the polarity test current pulse, and
      current or voltage direction reversal for monitoring the direction of current flow and for attribution of the supply voltage or current.

Advantageously, the power supply method comprises fault detection if the supply current is flowing in both directions or is blocked in both directions during the polarity test current pulse.

In a preferred embodiment, the power supply method comprises detection of the type of lighting system with light-emitting diodes with regulated voltage or regulated current supply by performing:
   determination of a dynamic resistance of said lighting system with light-emitting diodes, and
   comparison of said dynamic resistance with a threshold.

Preferably, the power supply method comprises determination of a regulated supply voltage for a lighting system with light-emitting diodes supplied with voltage comprising:
   injection of different voltage values, and
   detection of a supply voltage by choosing the lowest voltage value enabling an electric supply current greater than the threshold to be conducted.

Advantageously, the power supply method comprises determination of a regulated supply current for a lighting system with light-emitting diodes supplied with current comprising:
   injection of different current values to determine DC voltage values at ambient temperatures,
   injection of current values and monitoring of DC voltage variations, and
   detection of a supply current by choosing the lowest current value for which a DC voltage is lower than a portion of the DC voltage value at a pre-recorded ambient temperature.

Preferably, the power supply method comprises storing of at least one DC voltage value of the lighting system with light-emitting diodes at an ambient temperature or when cold before use.

In a particular embodiment, the power supply method comprises a diagnostic to detect the state of the light-emitting diodes in operation, and comprising:
   monitoring of the current when the lighting system with light-emitting diodes is supplied with voltage and/or monitoring of DC voltage when the lighting system with light-emitting diodes is supplied with current, and
   processing of a diagnostic result when the current exceeds a threshold if the system is supplied with voltage and/or when the DC voltage drops below a threshold when the system is supplied with current.

BRIEF DESCRIPTION OF THE DRAWINGS

Other advantages and features will become more clearly apparent from the following description of particular embodiments of the invention, given for non-restrictive example purposes only and represented in the appended drawings in which:

FIG. 11 represent a detailed flowchart of selection of supply current in a device and method according to an embodiment of the invention;

FIG. 12 illustrates plots of voltage variation in response to a current pulse for selection of current in devices and methods according to embodiments of the invention;

FIG. 13 represents a flowchart of diagnostic for a device and the method according to an embodiment of the invention;

FIG. 14 illustrates a plot of voltage variation for a diagnostic of a current-controlled lighting system with light-emitting diodes; and FIG. 15 illustrates a plot of current variation for a diagnostic of a voltage-controlled lighting system with light-emitting diodes.

DETAILED DESCRIPTION OF PREFERRED EMBODIMENTS

Figure 1:
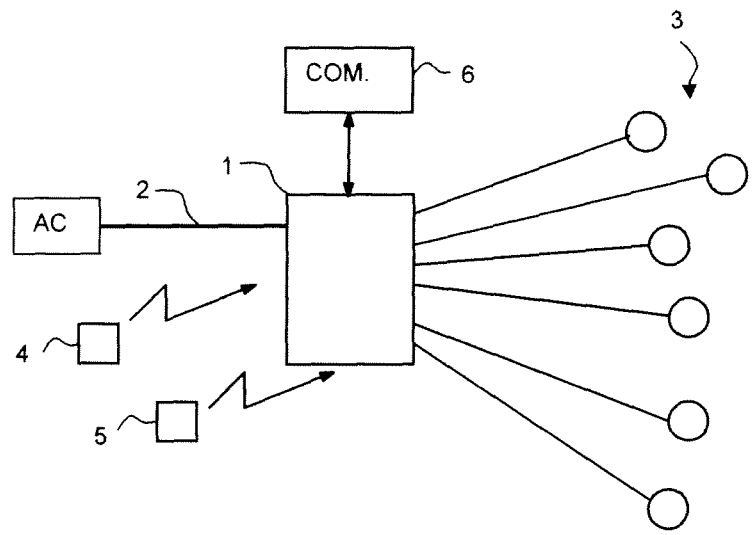
FIG. 1 represents a block diagram of a lighting assembly able to comprise a device according to an embodiment of the invention.

A block diagram of a lighting assembly with light-emitting diodes is represented in FIG. 1. It comprises a power supply device 1 designed to be connected to an electric power supply system 2. Lighting systems or lighting modules 3 with light-emitting diodes are connected to the lighting device 1. The lighting controls can be performed using remote controls or man-machine interfaces 4, light regulation sensors 5, or communication modules 6 connected with or without wires to the power supply device 1. To avoid a complex configuration of the power supply of lighting systems with light-emitting diodes, the power supply device 1 according to the invention enables automatic selection of the polarity, of voltage or current supply type, and/or of the value of the voltage or current supply.

Figure 2:
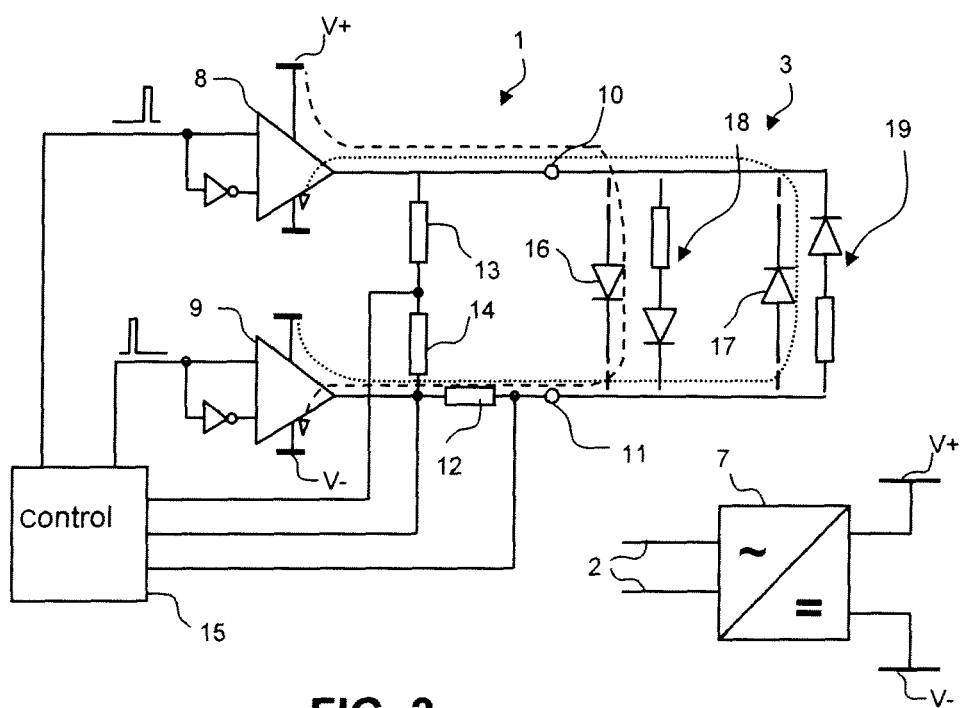
FIG. 2 represents a diagram of a power supply device of the lighting system with light-emitting diodes according to an embodiment of the invention.

FIG. 2 represents a diagram of a power supply device of a lighting system with light-emitting diodes according to an embodiment of the invention. This device comprises a DC power supply 7 connected to a power system 2 and providing a DC voltage with two polarities V+ and V−. This DC voltage is applied to electronic power circuits 8 and 9 represented by amplifiers. Outputs of the circuits 8 and 9 enable the voltage or current polarities to be reversed on output terminals 10 and 11. A current measurement resistor 12 is connected between an output of the circuit 9 and the output terminal 11 and voltage measurement resistors 13 and 14 are connected between the two outputs of the circuits 8 and 9. Measurement signals collected on the current measurement resistor 12 and the voltage measurement resistors 13 and 14 are supplied to a processing circuit 15. Inputs of the circuits 8 and 9 are connected to the processing circuit 15. The processing circuit 15 can thus monitor a supply voltage and current according to voltage measurement and current measurement and predefined setpoints. In this case, the DC current power supply device of FIG. 2 comprises current or voltage limiting for power supply of a lighting system with light-emitting diodes. Henceforth in the description, the lighting system with light-emitting diodes is also called lighting module or luminaire.

According to an embodiment of the invention, the power supply device comprises automatic selection of the power supply of said lighting system with light-emitting diodes. The lighting system with light-emitting diodes can be connected in a first or second direction or polarity, be of voltage-controlled or current-controlled type, and have several operating voltages or currents. In FIG. 2, the light-emitting diodes 16 and 17 can be supplied with current and the diodes 18 and 19 associated with limiting resistors be supplied with voltage. All the light-emitting diodes can be supplied in a first direction or second direction.

Figure 3:
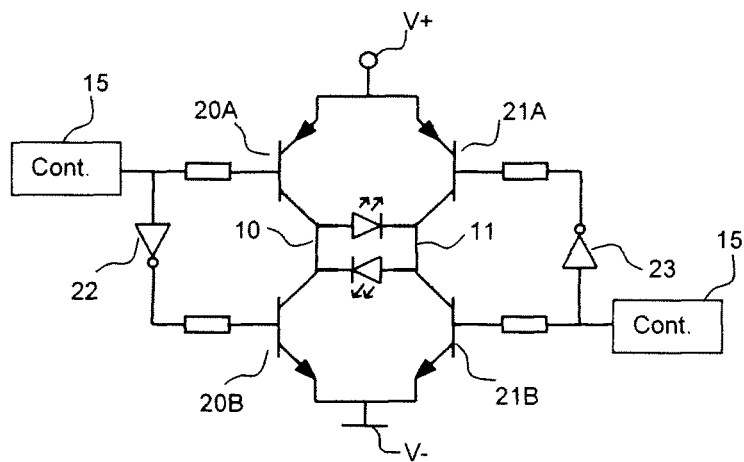
FIG. 3 represents a diagram of a polarity inverter for a power supply device according to an embodiment of the invention.

FIG. 3 represents a diagram of a polarity inverter for a power supply device according to an embodiment of the invention. This inverter circuit can be integrated in the circuits 8 and 9 to reverse the direction of the supply current or voltage. It comprises transistors connected in an H, each arm of the H comprising two transistors respectively 20A and 20B, and 21A and 21B commanded in complementary manner by inverters 22 and 23.

Figure 4:
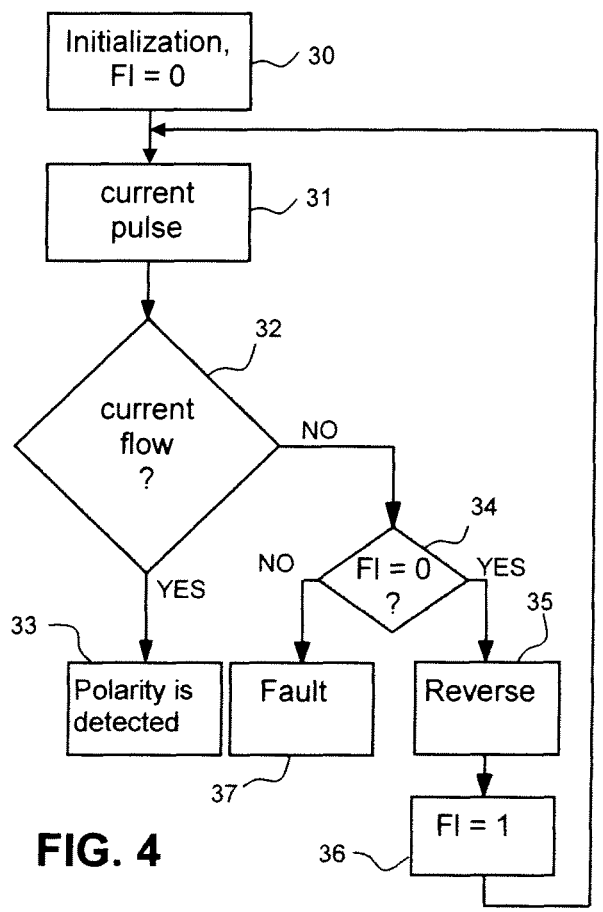
FIG. 4 represents a flowchart of detection and attribution of polarity for a device and the method according to an embodiment of the invention.

FIG. 4 represents a flowchart of detection and attribution of polarity for a device and a method according to an embodiment of the invention.

This flowchart comprises an initialisation step 30. In this embodiment, automatic detection of the direction of connection of said lighting system is performed by injecting at least one polarity test current pulse to detect current flow. Thus, a step 31 enables a current pulse to be injected. Then a step 32 monitors said supply voltage and/or current during the polarity test current pulse. In particular, in this step 32, flow of the current is monitored. If the current is flowing, the polarity is detected at a step 33. If current flow is not detected, a test of an indicator is performed in a step 34 to know a first flow. In the case of a first flow, indicator at zero, a step 35 performs a reversal of the direction of the current or voltage for monitoring the direction of current flow and for attribution of the direction of the supply voltage or current. After inversion, a step 36 changes the state of the indicator, for example to one. Then the polarity detection cycle is restarted. The pulse is injected in another direction in step 31 and current flow is detected in step 32. If the current is flowing, the current direction is detected in step 33. If not, in step 34, monitoring of the indicator is performed. If the indicator is at one, which means a second flow, a step 37 indicates a fault as the current is not flowing in either direction.

It is possible in another flowchart that is not represented to also detect a fault if a significant current is flowing in both directions. Thus, a device and method according to embodiments of the invention comprise fault detection if the supply current is flowing in both directions or blocked in both directions during the polarity test current pulse.

Figure 5:
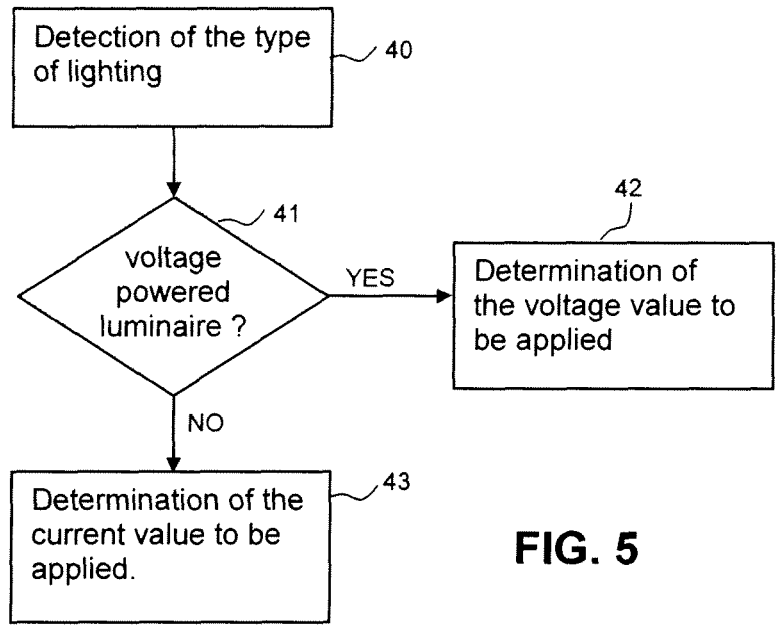
FIG. 5 represents a general flowchart of selection of the type of lighting module for a device and a method according to an embodiment of the invention.

FIG. 5 represents a general flowchart of selection of the type of lighting module for a device and the method according to an embodiment of the invention. A step 40 initialises detection of the type of lighting module with voltage or current supply. A step 41 selects the type of lighting module. If the lighting module has to be supplied with voltage by a step 42 determines the voltage value to be applied. If the lighting module has to be supplied with current, a step 43 determines the current value to be applied.

Figure 6:
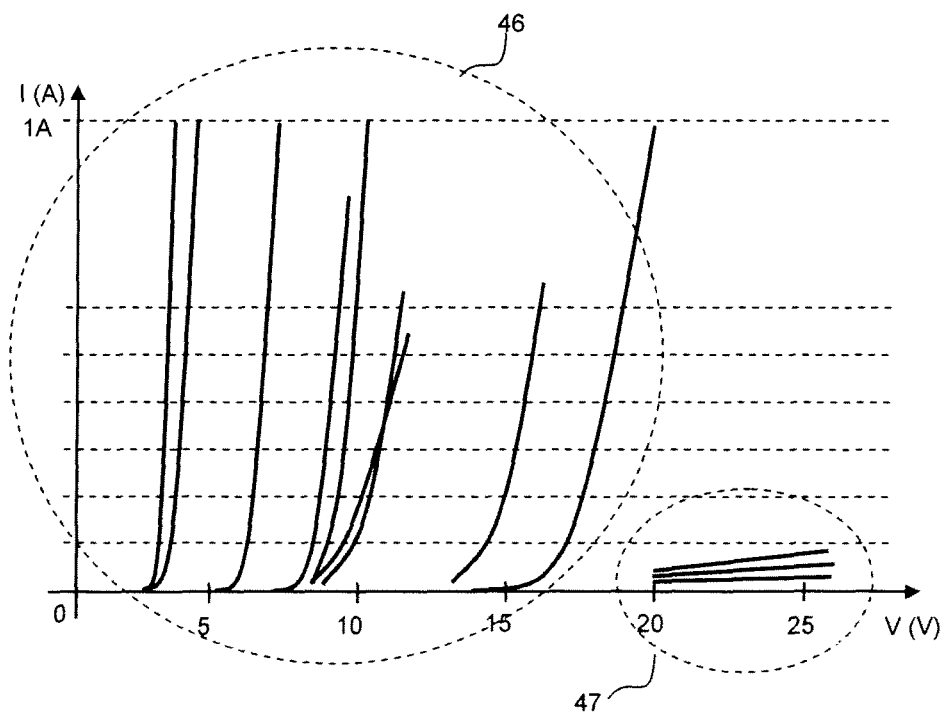
FIG. 6 illustrates plots of electric characteristics of lighting modules for devices and methods according to embodiments of the invention.

FIG. 6 illustrates plots of curves of electric characteristics of lighting modules for devices and methods according to embodiments of the invention. The lighting modules to be supplied with current generally comprise light-emitting diodes connected in series allowing flow of high current when a test pulse is applied. Their DC voltages are added and the total voltage is a function of the number of diodes. A curve area 46 delineates curves of diodes or lighting modules to be commanded in current. The lighting modules to be supplied with voltage generally comprise light-emitting diodes comprising voltage-current converters such as current limiters resistors. A curve area 47 delineates curves of diodes or lighting modules to be voltage-controlled.

Figure 7:
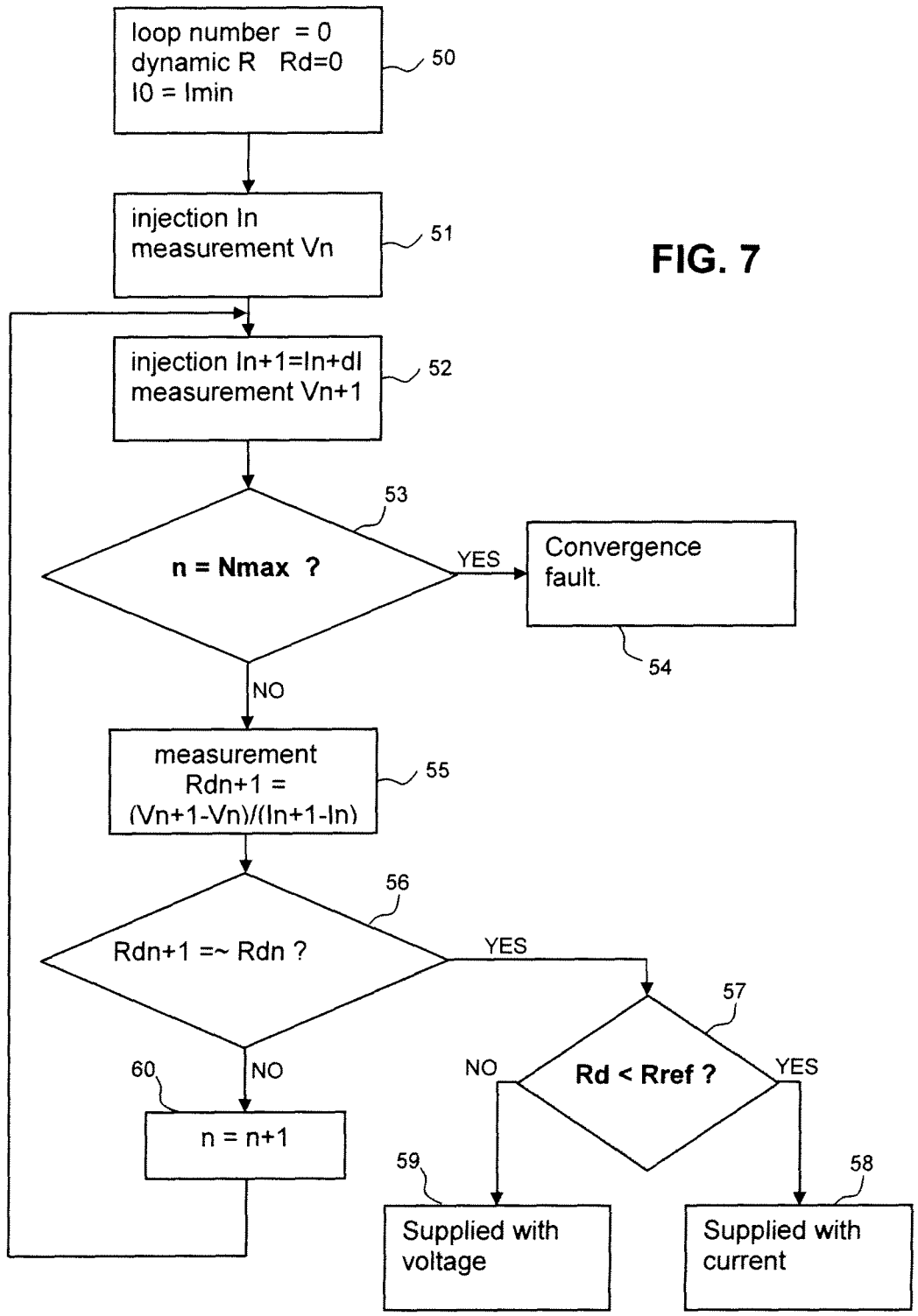
FIG. 7 represents a detailed flowchart of selection of the type of lighting module for a device and method according to an embodiment of the invention.

FIG. 7 represents a detailed flowchart of selection of the type of lighting module for a device and method according to an embodiment of the invention. The processing circuit detects the type of lighting system with light-emitting diodes to be supplied with regulated voltage or regulated current. Detection of type comprises determination of a dynamic resistance of said lighting system with light-emitting diodes and comparison of said dynamic resistance with a threshold. For example, a value of this threshold can preferably be 14 ohms.

A step 50 initialises the values of number of loops or passages, of dynamic resistance and minimum injection current. A step 51 performs a first injection of a current In and measurement of a voltage Vn. A step 52 performs a second injection of a current In+1 and measurement of a voltage Vn+1. A step 53 detects if the maximum number Nmax of iterations is reached. If this number Nmax is reached, a step 54 indicates a convergence fault. A step 55 determines a new value of the dynamic resistance or slope. Then a step 56 checks whether the dynamic resistance or slope is almost stable, for example with a deviation of less than 5%. If the dynamic resistance or slope is stable, then a step 57 compares the dynamic resistance or slope with one or more references to determine whether the lighting module is supplied with current or voltage. Thus, if the dynamic resistance is lower than a reference, the lighting module is supplied with current, step 58, otherwise the dynamic resistance is high and the lighting module is supplied with voltage, step 59. If in step 56 the dynamic resistance is not stable, a step 60 increases a number n of iterations. Then a new injection and measuring cycle is started.

Figure 8:
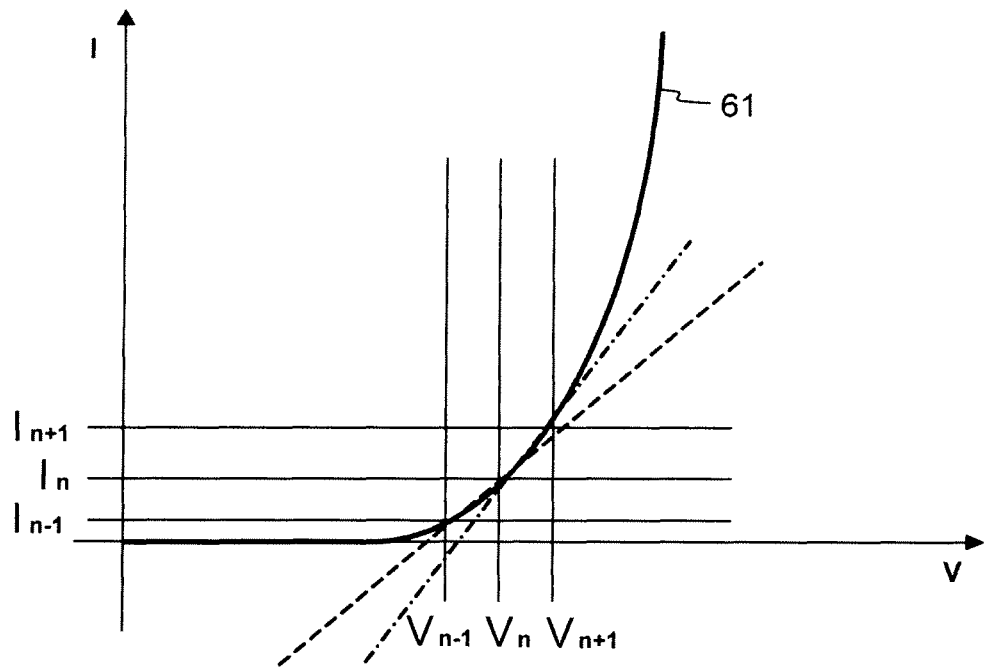
FIG. 8 illustrates a plot of electric characteristics of current-voltage lighting modules to determine dynamic resistance in devices and methods according to a flowchart of FIG. 7.

FIG. 8 illustrates a curve plot 61 of electric characteristics of lighting modules to determine the dynamic resistance in devices and methods according to a flowchart of FIG. 7. The parents of the resistance of this curve indicates a lighting module to be supplied with current. And another embodiment, it is also possible to determine the value of the dynamic resistance from a curve plot I. $dV/dI=f(I)$.

Figure 9:
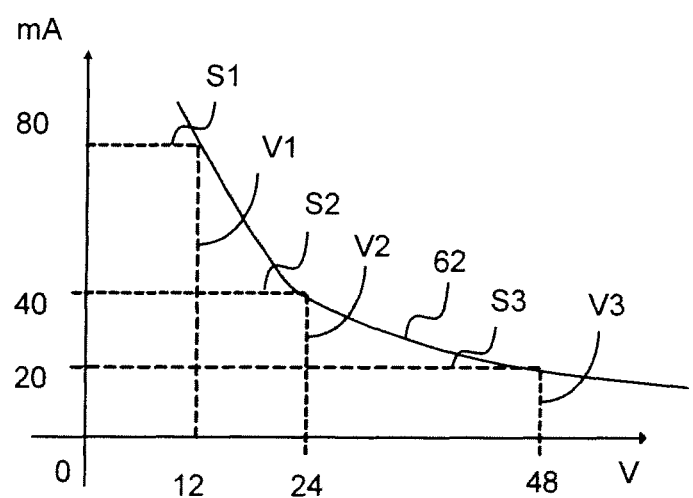
FIG. 9 illustrates a plot of current or voltage selection for devices and methods according to embodiments of the invention.
Figure 10:
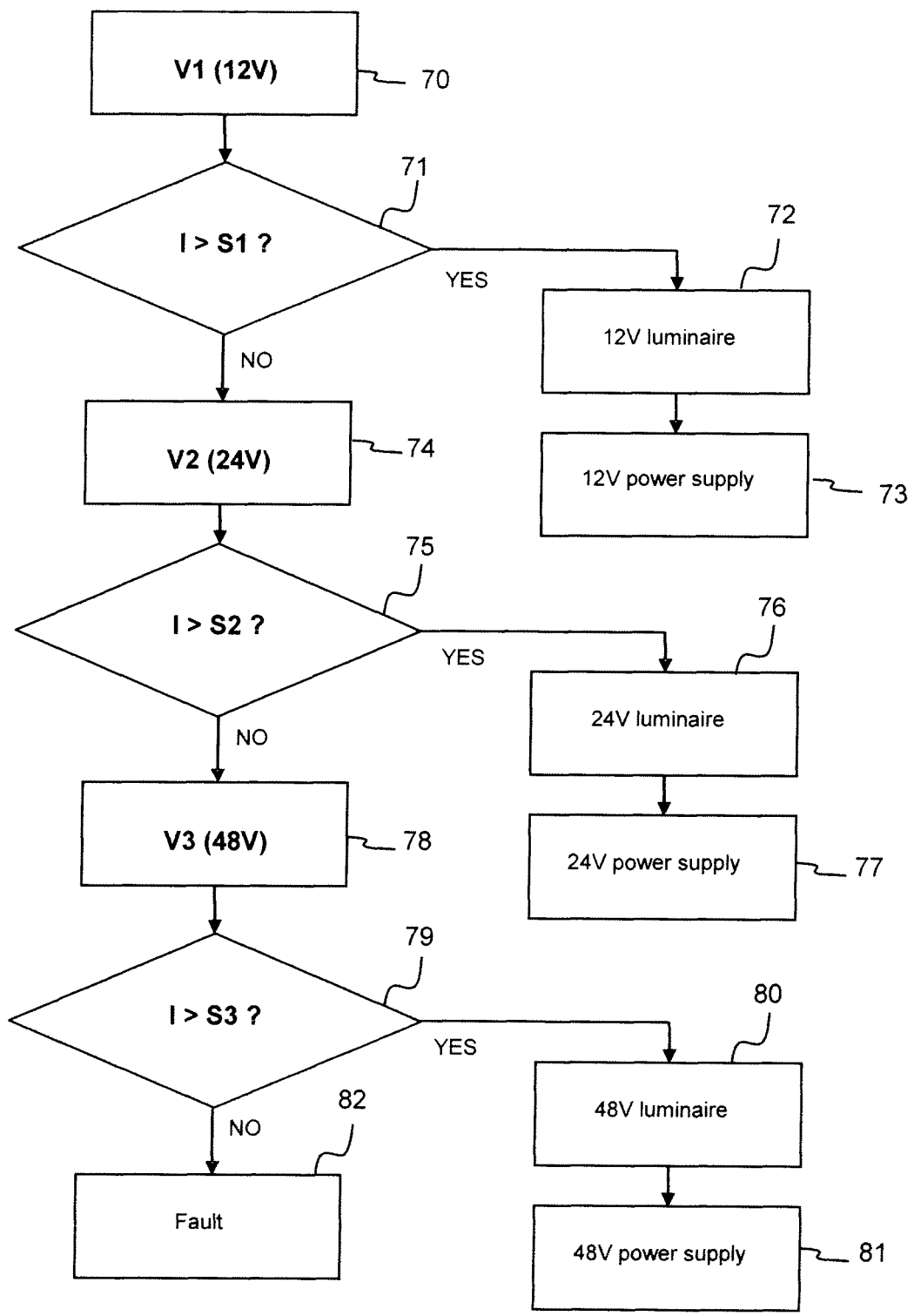
FIG. 10 represents a detailed flowchart of selection of supply voltage in a device and a method according to an embodiment of the invention.

FIG. 9 illustrates a curve plot of current or voltage selection for devices and methods according to embodiments of the invention. For this monitoring, it is established that the lighting modules consume a minimum of power, for example about 1 watt. Curve plot 62 defines a limit acting as monitoring reference for the flowchart of FIG. 10. FIG. 10 presents a detailed flowchart of supply voltage selection in a device and method according to an embodiment of the invention. The processing circuit thus commands injection of different voltage values and performs detection of a supply voltage by choosing the lowest voltage value enabling electric supply current greater than a threshold to be conducted.

In a step 70, a first low voltage V1 is applied to the lighting module. Then a step 71 checks whether a first current threshold S1 is exceeded. If the threshold S1 is exceeded, a step 72 indicates that the lighting module is to be supplied with voltage V1 and a step 73 actuates power supply of the lighting modules. If the threshold S1 is not reached, a second intermediate voltage V2 is applied to the lighting module in a step 74. Then a step 75 checks whether a second current threshold S2 is exceeded. If the threshold S2 is exceeded, a step 76 indicates that the lighting module is to be supplied with voltage V2 and a step 75 actuates supply of the lighting module. If the threshold S2 is not reached, a third high voltage V3 is applied to the lighting module in a step 78. Then a step 79 checks whether a third current threshold S3 is exceeded. If the threshold S3 is exceeded, a step 80 indicates that the lighting module is to be supplied with voltage V3 and a step 81 actuates supply of the lighting module. If the last threshold S3 is not reached, a step 82 indicates that the lighting module is faulty or disconnected. In the above flowchart, the voltages V1, V2 and V3 can for example have values respectively of 12, 24 and 48 volts. Examples of thresholds S1, S2 and S3 can be 80, 40 and 20 milliamperes respectively.

FIG. 11 represents a detailed flowchart of selection of supply current in a device and method according to an embodiment of the invention. In this case the processing circuit performs:
   injection of different current values to determine DC voltage values at ambient temperatures,
   storing of at least one DC voltage value of the lighting system with light-emitting diodes at an ambient temperature or cold before use.
   injection of current values and monitoring of DC voltage variations, and
   detection of a supply current by choosing the lowest current value for which a DC voltage is lower than a portion of the DC voltage value at a pre-recorded ambient temperature.

In FIG. 11, a flowchart has an initialisation phase comprising three steps 90, 91, 92 during which three current pulses I1 then I2 then I3 are injected. During these current pulses, three voltages at ambient temperatures and/or cold before use, respectively V1a, V2a and V3a, are measured and stored. In a step 93, a current I2 is injected and regular measurement of the DC voltage Vd (dt) is performed to evaluate the voltage variation. A step 94 checks whether the voltage Vd is lower than a predefined portion of a voltage V2a at ambient temperature. If Vd is lower than a percentage k of V2a, a step 95 indicates that the lighting module has to be supplied with I1 and a step 96 supplies the lighting module with current I1 for example 350 mA. If not, in a step 97, a second selection takes place between a lighting module with I2 and a lighting module with I3. For example k can be 94%. In a step 98, a current I3 is injected and regular measurement of the DC voltage Vd (dt) is performed to evaluate the voltage variation. A step 99 checks whether the voltage Vd is lower than a predefined portion of the voltage V3a at ambient temperature. If Vd is lower than V3a, a step 100 indicates that the lighting module has to be supplied with I2 and a step 101 supplies the lighting module with current I2 for example 700 mA. If not a step 102 indicates that the lighting module has to be supplied with I3 and a step 103 supplies the lighting module with current I3 for example 1000 mA.

This selection of lighting modules supplied with current is thus based on the variation of the DC voltage Vd according to the temperature. The junction temperature is dependent in this case on flow of the test currents I2 and I3. FIG. 12 illustrates curve plots of variations of voltage 110 in response to a current 111 for selection of the supply current I1, I2, and I3 in devices and methods according to embodiments of the invention.

FIG. 13 represents a flowchart of diagnostic for a device and method according to an embodiment of the invention. The processing circuit comprises diagnostic means for detecting the state of the diodes in operation according to the type of power supply, said processing means performing:
   monitoring of the current when the lighting system with light-emitting diodes is supplied with voltage and/or monitoring of DC voltage when the lighting system with light-emitting diodes is supplied with current, and
   indication of a fault when the current exceeds a threshold if the system is supplied with voltage and/or when the DC voltage drops below a threshold when the system is supplied with current.

The purpose of the diagnostic is to determine whether the lighting modules remain within acceptable temperature ranges. Possible causes of overshooting the ranges can for example be incorrect installation, a degradation of the performances of the lighting module with time, or an accidental ventilation fault of the lighting module.

A step 120 initialises diagnostic of the lighting module, then a step 121 detects whether the lighting module has to be supplied with current or voltage. This step can comprise flowcharts described in the foregoing. For a lighting module supplied with voltage, a step 122 measures a supply current IL in the course of use. If the current IL exceeds a threshold SIL in a step 123, a step 124 actuates processing of the result of the diagnostic. For a lighting module supplied with current, a step 125 measures a supply voltage VL in the course of use. If the voltage VL drops below a threshold SVL in a step 126, a step 127 actuates processing of the result of the diagnostic.

Processing of the diagnostic of steps 124 and 127 can for example be an alarm, shutdown of the lighting or an automatic readjustment of the power supply. This processing of the diagnostic can also have the consequence of reducing the lighting level.

FIG. 14 illustrates a plot 130 of variation of voltage VL for diagnostic of a current-controlled lighting system with light-emitting diodes. At a time t1, the voltage VL drops below a threshold SVL and processing of the result of the diagnostic is triggered. FIG. 15 illustrates a plot 131 of variation of current IL for diagnostic of a voltage-controlled lighting system with light-emitting diodes. At the time t2, the current IL exceeds the threshold ISL and processing of the result of the diagnostic is triggered.

The current and voltage values mentioned above are given as examples. The invention can be applied to other voltages or currents and to a different number of voltage or current values.

The invention can be applied to different types of coloured or white light-emitting diodes, produced using various technologies for example AlInGaP or InGaN.

This invention can also apply to organic light-emitting diodes or OLEDs produced using various technologies.

The invention claimed is:

1. A power supply device comprising:
    a DC power supply for providing a limited voltage or current at outputs for supplying power to a lighting system having light-emitting diodes, said power supply comprising voltage measuring means and current measuring means for monitoring a supply voltage and current, and
    voltage or current selection means connected to said power supply selecting a voltage or current to be applied to said lighting system having light-emitting diodes, said selection means comprising automatic means for detecting the direction of connection of said lighting system, said detecting means comprising:
    means for injecting at least one polarity test current pulse for detection of current flow,
    processing means comprising means for monitoring supply voltage and current during a polarity test current pulse, and
    means for reversing the direction of the current or voltage controlled by said processing means for monitoring the direction of current flow and for attribution of the direction of a supply voltage or current.

2. The device according to claim 1 wherein said processing means comprise fault detection means for detecting whether the supply current is flowing in both directions or is blocked in both directions during the polarity test current pulse.

3. The device according to claim 1 wherein said processing means comprise detection for determining a dynamic resistance of a lighting system having light-emitting diodes, and means for comparing said dynamic resistance with a threshold.

4. The device according to claim 3 wherein said processing means comprise means for determining a regulated supply voltage for a lighting system having light-emitting diodes supplied with voltage, said determining means comprising:
    means for injecting voltage values, and
    means for detecting a supply voltage by choosing the lowest voltage value enabling an electric supply current greater than a threshold to be conducted.

5. The device according to claim 3 wherein said processing means comprise means for determining a regulated supply current for a lighting system having light-emitting diodes supplied with current, said determining means comprising:
    means for injecting current values for determining DC voltage values at ambient temperatures and/or when cold before use,
    means for injecting current values and for monitoring DC voltage variations, and
    means for detecting a supply current by choosing the lowest current value for which a DC voltage is lower than a portion of the DC voltage value at a selected ambient temperature.

6. The device according to claim 1 wherein said processing means comprise diagnostic means for detecting the state of the light-emitting diodes in operation, said processing means comprising:
    means for monitoring the current when the lighting system having light-emitting diodes is supplied with voltage or for monitoring DC voltage when the lighting system having light-emitting diodes is supplied with current, and
    means for processing a diagnostic result when the current exceeds a threshold value when the system is supplied with voltage or when the DC voltage drops below a threshold value when the system is supplied with current.

7. A lighting assembly with light-emitting diodes comprising at least one power supply device according to claim 1, said assembly for connecting to an electric power supply system, said assembly additionally comprising processing means for processing automatic selection of the power supply of said at least one lighting assembly having light-emitting diodes.

8. A method of operating a power supply for a lighting system having light-emitting diodes comprising:
    selection of a supply voltage or current to be applied to said lighting system having light-emitting diodes, and
    monitoring said supply voltage and said supply current by automatic detection of the direction of connection of said lighting system by performing:
    injection of least one polarity test current pulse,
    monitoring said supply voltage and said supply current during the polarity test current pulse, and
    reversing current or voltage direction for monitoring the direction of current flow and for attribution of the supply voltage or current.

9. The power supply method according to claim 8 comprising fault detection by detecting whether the supply current is flowing in both directions or is blocked in both directions during the polarity test current pulse.

10. The power supply method according to claim 8 comprising detection of the type of lighting system having light-emitting diodes with regulated voltage or regulated current supply by
    determining a dynamic resistance of said lighting system having light-emitting diodes, and
    comparing said dynamic resistance with a threshold value.

11. The power supply method according to claim 8 comprising determining a regulated supply voltage for a lighting system having light-emitting diodes supplied with voltage by:
    injection of different voltage values, and
    detection of a supply voltage by choosing the lowest voltage value capable of enabling an electric supply current greater than the threshold value to be conducted.

12. The power supply method according to claim 8 comprising determining a regulated supply current for a lighting system having light-emitting diodes supplied with current by:
    injection of different current values to determine DC voltage values at certain ambient temperatures,
    injection of current values and monitoring of DC voltage variations, and
    detection of a supply current by choosing the lowest current value for which a DC voltage is lower than a DC voltage value at a selected ambient temperature.

13. The power supply method according to claim 8 comprising storing at least one DC voltage value of the lighting system having light-emitting diodes at a certain ambient temperature or when cold before use.

14. The power supply method according to claim 8 comprising detecting the state of the light-emitting diodes in operation, comprising:
    monitoring the current when the lighting system having light-emitting diodes is supplied with voltage or current, and
    processing a diagnostic result when the current exceeds a threshold value when the system is supplied with voltage or current.

* * * * *